(12) United States Patent
Campeau (10) Patent No.: US 11,653,567 B2
(45) Date of Patent: May 16, 2023

(54) THERMOELECTRIC GENERATOR USING IN SITU PASSIVE COOLING

(71) Applicant: Gerard Campeau, Newmarket (CA)

(72) Inventor: Gerard Campeau, Newmarket (CA)

(*) Notice: Subject to any disclaimer, the term of this patent is extended or adjusted under 35 U.S.C. 154(b) by 303 days.

(21) Appl. No.: 17/300,022

(22) Filed: Feb. 16, 2021

(65) Prior Publication Data

US 2022/0262706 A1 Aug. 18, 2022

(51) Int. Cl.
*H10N 10/13* (2023.01)
*H10N 10/17* (2023.01)

(52) U.S. Cl.
CPC ............. *H10N 10/13* (2023.02); *H10N 10/17* (2023.02)

(58) Field of Classification Search
CPC ....... H01L 35/32; H01L 35/30; F28D 21/001; F28D 7/00; F28D 9/00; F28D 1/00; F28D 1/06; F28D 2020/0065; F28D 1/0308; F28D 9/0031; F28D 9/0037; F28D 1/0358; F28D 9/0012; F28D 9/0025; F28D 9/0081; F28F 3/005; F28F 3/08; F28F 1/00; F28F 1/42; B60H 2001/2275; F01N 5/025; F24F 5/0442; F23M 2900/13003; F02G 5/02; F02G 2260/00; F02G 2262/00

USPC ............... 136/205, 210, 209, 212, 208, 207; 165/164, 172, 179, 132, 165, 166

See application file for complete search history.

(56) References Cited

U.S. PATENT DOCUMENTS

| | | | | |
|---|---|---|---|---|
| 5,901,572 A | * | 5/1999 | Peiffer | B60H 1/32014 62/480 |
| 9,797,652 B1 | * | 10/2017 | Wilkerson | F25D 31/002 |
| 9,844,300 B2 | * | 12/2017 | Cedar | F24B 1/202 |
| 10,964,874 B2 | * | 3/2021 | Campeau | H01M 10/443 |
| 2004/0134932 A1 | * | 7/2004 | Lobdell | B67D 3/0029 222/189.06 |
| 2006/0150637 A1 | * | 7/2006 | Wauters | F25D 31/006 62/3.64 |
| 2009/0151342 A1 | * | 6/2009 | Major | F01N 13/146 422/174 |
| 2013/0340802 A1 | * | 12/2013 | Jovovic | H01L 35/30 136/201 |
| 2015/0243870 A1 | * | 8/2015 | Kushch | F24B 15/00 136/211 |

* cited by examiner

*Primary Examiner* — Justin M Jonaitis (57) ABSTRACT

A portable electrical power generation system using thermoelectric modules to produce voltage from a temperature differential. The temperature differential is maintained using a passive cooling system including a retained liquid coolant and heat from a heated fluid.

6 Claims, 6 Drawing Sheets

THERMOELECTRIC GENERATOR USING IN SITU PASSIVE COOLING

FEDERALLY SPONSORED RESEARCH

Not applicable

SEQUENCE LISTING OR PROGRAM

Not applicable

FIELD OF THE INVENTION

The present invention relates to portable and permanent generators of electrical energy and more specifically to generators using solid state Seebeck Effect thermoelectric (TEG) modules and various thermodynamic arrangements including passive cooling methods to maintain suitable module operation.

BACKGROUND OF THE INVENTION

Modern Seebeck Effect thermoelectric modules transform a temperature difference across the module, between the hot and cold sides of the device, into a usable voltage. While the temperature difference is maintained, the module can provide a continuous power source. A module in these conditions is considered an on-demand electrical energy generation system.

Passive liquid cooling: The prior art describes thermoelectric generation systems using passive liquid cooling. For example U.S. Pat. No. 8,674,530 B2 discloses a cooking pot filled with a phase change material (e.g. water) as a heat exchanger using passive liquid cooling. However, this format does not maintain a stable cold side surface temperature. The coolant boils and rapidly evaporates. Without sufficient liquid there is insufficient cooling and the thermoelectric module fails due to excessive heat concentration on the hot side of the module. Moreover, the hot side is in contact with the heat source through a relatively thin aluminum interface. In this configuration, the temperature of the hot side is easily pushed beyond the recommended temperature and will damage the TEG device.

This configuration produces poor temperature differential because the side walls of the vessel containing the coolant are fully within the heat envelope of the combustion source and this raises the coolant temperature. Thus, the temperature difference across the TEG device is reduced and the available power is reduced.

Providing a heat source using combustion of biomass: The prior art discloses other attempts to use thermoelectric modules for power generation. In particular, U.S. Pat. No. 8,851,062 B2 describes a system with a heat source based on the combustion of biomass and provides a fan to generate air flow to both convectively cool the module's cold side and to improve biomass combustion. However, the fan is powered by an internal battery which must be initially charged before it can be used to facilitate the cooling of the module. Moreover, if the internal battery is discharged below the threshold to operate the fan, the system's cooling fails, the power from the thermoelectric module fails, and the thermoelectric module can be exposed to excessive temperature since heat is not being removed from the cold side.

The primary requirement for continuous energy generation using thermoelectric modules is maintaining a sustained temperature difference across the module. This requires a constant source of heat and a method for removing that heat from the cold side. It is also desirable to reduce the variation in the temperature difference so that there is little deviation (less than 10%) in the power output over time. The present invention provides these needed characteristics in a novel and non-obvious thermoelectric generator that uses a passive cooling strategy.

SUMMARY

In part, this disclosure relates to methods and systems for a thermoelectric generator system. The system is designed and constructed to generate usable voltage using thermoelectric modules each having a designated hot and cold side, a heat absorber thermally connecting the hot side of each module to a heat source, and a heat exchanger vessel, thermally connecting the cold side of each module to a liquid coolant retained by the vessel.

In one aspect, the heat absorber and heat exchanger vessel are constructed with at least one planar surface to improve the thermal connection with the hot side and cold side of thermoelectric module, respectively.

In another aspect, the heat exchanger vessel and heat absorber are constructed from extruded aluminum forms having integral fins whose dimensions and spacing are conducive to the efficient absorption and transfer of heat. In this embodiment, the heat absorber fins are directly immersed in a fluid heat source. The absorber fins conduct heat to the hot side of the modules. Moreover, the heat exchanger vessel is extruded with both external and internal fins such that the internal fins are immersed in the retained liquid coolant and provide an efficient heat sink for the cool side. Thus, using these components a sufficient temperature difference is maintained across the modules and a corresponding stable voltage is provided.

In another aspect, a plurality of heat exchanger vessels of similar configuration are provided. In this case, the combined retained liquid volume is at least 10 liters of the liquid coolant. The combined liquid volume provides larger heat capacity and greater heat dissipation. In addition, at least a second heat absorber is provided to conduct heat from a common heat source such as the exhaust flue stream of a wood fired heating stove, a natural gas fireplace appliance, or other biomass combustion site. This embodiment can be further scaled with more vessels, larger liquid volumes, and more heat absorbers.

In another aspect, an external Direct Current (D.C.) fan powered by the present thermoelectric generator system could be used to direct convective air flow to the exterior fins of a heat exchanger vessel. This configuration improves the flow of heat from the external fins particularly in conditions of elevated ambient temperature and humidity.

Other embodiments are within the scope of the present invention. Different combustion fuels can be used as the heat source such as alcohol based fuels suitable for indoor use.

Although the present disclosure relates to different aspects and embodiments, it is understood that the different aspects and embodiments disclosed can be integrated, combined, or used together as a combination system, or in part, as separate components, devices, and systems, as appropriate.

BRIEF DESCRIPTION OF THE FIGURES

The figures are to be considered illustrative in all aspects and are not intended to limit the disclosure. The figures are not necessarily to scale.

DETAILED DESCRIPTION

It should be understood that the present invention is not limited in its application to the details of construction and the arrangement of components set forth in the following description or illustrated in the drawings. The invention is capable of other embodiments and of being practiced or of being carried out in various ways.

Also, it is to be understood that the terminology used herein is for the purpose of description and should not be regarded as limiting. The use of "includes", "including", "comprising," or "having" and variations is meant to encompass the items listed and their equivalents. Unless otherwise limited, the terms "connected," "coupled", "configured" and "mounted" and variations are used broadly and encompass direct and indirect connections, couplings and mountings. In addition, the terms "connected" and "coupled" and variations may include thermal, mechanical, and electrical connections. Furthermore, and as described in subsequent paragraphs, the specific mechanical and/or other configurations illustrated in the drawings are intended to exemplify embodiments of the invention. However, other alternative mechanical and/or electrical and other configurations are possible which are considered to be within the teachings of the disclosure. It will be understood that the dimensions suggested in the description of the figures are for illustration only and are not limited to those presented in this disclosure.

Figure 1:
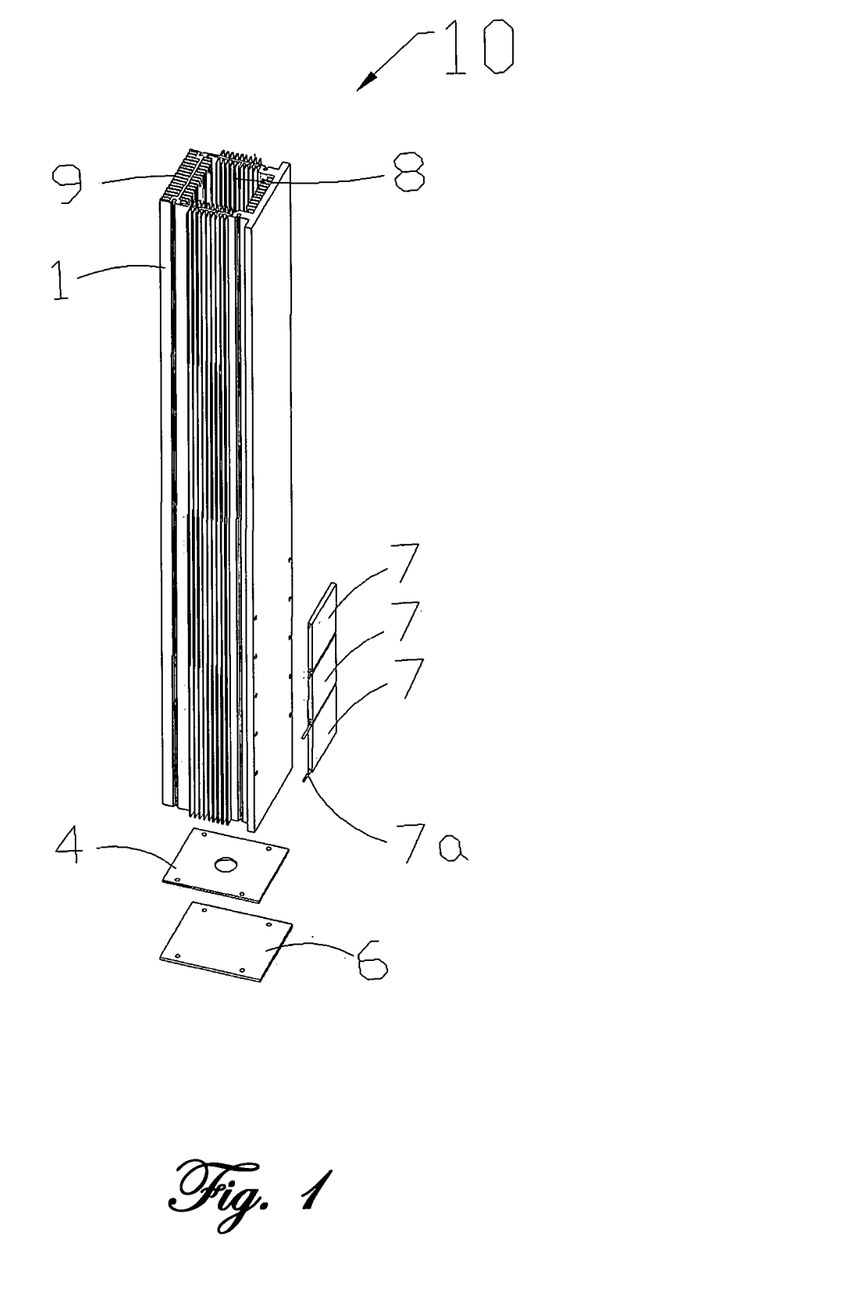
FIG. 1 is an isometric view of a preferred embodiment of a heat exchanger vessel.

FIG. 1 shows an embodiment of a heat exchanger vessel assembly 10 accommodating a plurality of thermoelectric modules 7, comprising a vessel 1 having a first end and a second end, and capable of retaining a liquid coolant, water being a typical choice, although a glycol based coolant can be substituted if the potential exists for the water to freeze if ambient conditions allow freezing temperatures. The vessel has at least one planar surface suitable for efficient thermal mounting of thermoelectric modules. The cold side of each of the plurality of thermoelectric modules 7, are coupled to the outer planar surface of the vessel 1. The planar surface of the vessel may be finished and prepared to improve the thermodynamic efficiency of the coupling. For example, the surface may be polished and/or a thermal conductive paste may be added between the module surface and vessel. These are efficiency improvements known to the art. Electrical connections 7a are provided from the plurality of thermoelectric modules 7. The heat exchanger vessel is formed by extrusion of aluminum into a vertically oriented rectangular vessel of such dimensions and height to retain at least 1.5 liters of coolant in one embodiment with a corresponding height of at least 450 mm. The first end of the vessel is open which is appropriate if evaporation of the coolant is minimal or additional coolant can be conveniently added to replace any evaporation of the coolant.

The second end is fastened to an aluminum plate 6 which serves to retain the liquid coolant in conjunction with lower silicon rubber based sealing gasket 4 capable of operating up to 500 degrees Celsius without deformation of the gasket.

The heat exchanger vessel 1 is fabricated such that the internal and external surfaces other than the planar surface have fins. The fins are longitudinally fabricated with their long dimension parallel to the long dimension of the vessel. In this embodiment, the longitudinally oriented fins of the vessel are also vertically oriented. The internal fins 8 are extruded such that they protrude from the interior wall of the vessel to the outer side, and are immersed in the liquid coolant on the inside of the vessel. Heat is efficiently conducted from the internal fins 8 to the external fins 9 in accordance with the increased surface area for heat dissipation. The external fins 9 transfer the heat to the ambient air through convection. To increase the rate of heat transfer from the external fins 9 to the ambient air, a system may be installed to force convection, for example an external fan. This will improve heat transfer even with higher than ideal ambient temperature or humidity.

In addition, the vertical orientation of the vessel and the fins is intended to take advantage of thermal gradients that develop in the vessel as absorbs heat substantially from the bottom. In general, the more buoyant heated liquid moves upward while cooler liquid returns downward by gravity. An internal liquid flow loop is created. The flow of liquid past the internal fins improves the rate of heat transport from the internal liquid to the exterior fins. Thus, the system does operate as a passive cooling system without the need for an externally powered liquid pump in situations where the ambient temperature is conducive to passive operation.

Figure 2:
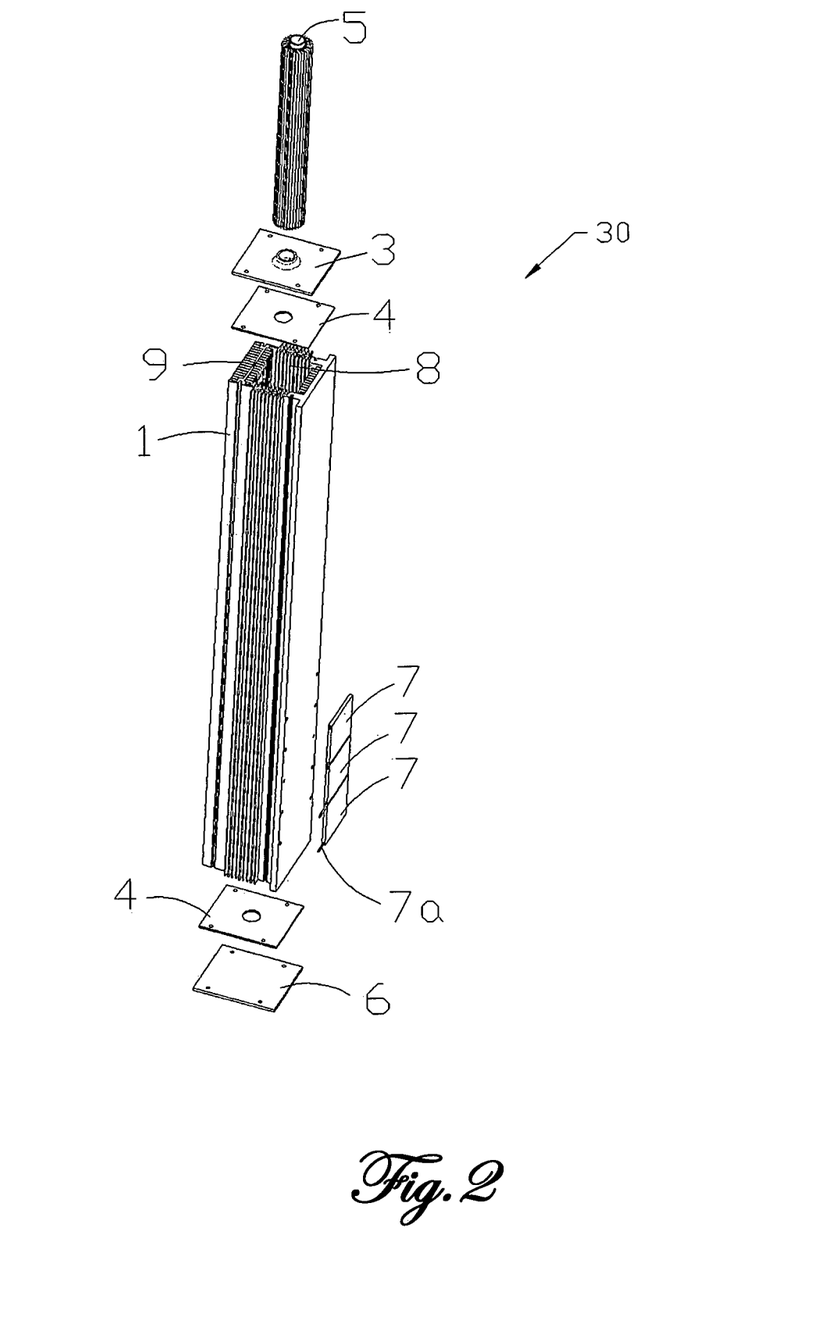
FIG. 2 is an isometric view of a preferred embodiment of a heat exchanger vessel with a condenser tube coupled to the first end of the vessel.

In the embodiment of FIG. 2, a condenser tube 5 is an option with a passive system, which is fabricated by extrusion of aluminum with a plurality of densely spaced fins at least 2 millimeters in width and at least 10 millimeters in height at a minimum distance of 2 millimeters between adjacent fins, and forming a circular extrusion with an internal diameter of at least 10 millimeters. The exterior surface of the condenser tube is exposed to the ambient environment. In a manner known to the art, under suitable ambient conditions, heat from vaporized coolant is dissipated from the interior of the condenser tube and into the external environment through the outer surface fins. As the vapor releases heat it condenses to its liquid phase and eventually returns to the liquid coolant in the vessel 1. There is a vent plug on top of the condenser tube which prevents over-pressure in the vessel and condenser tube system. The condenser tube 5, cover plate 3, and upper sealing gasket 4 are optional choices when used in portable or non-permanent applications, or lower temperature conditions where the coolant remains comfortably below boiling. Coolant temperatures in the vicinity of 80 Degrees Celsius are an example of such a condition.

Figure 3:
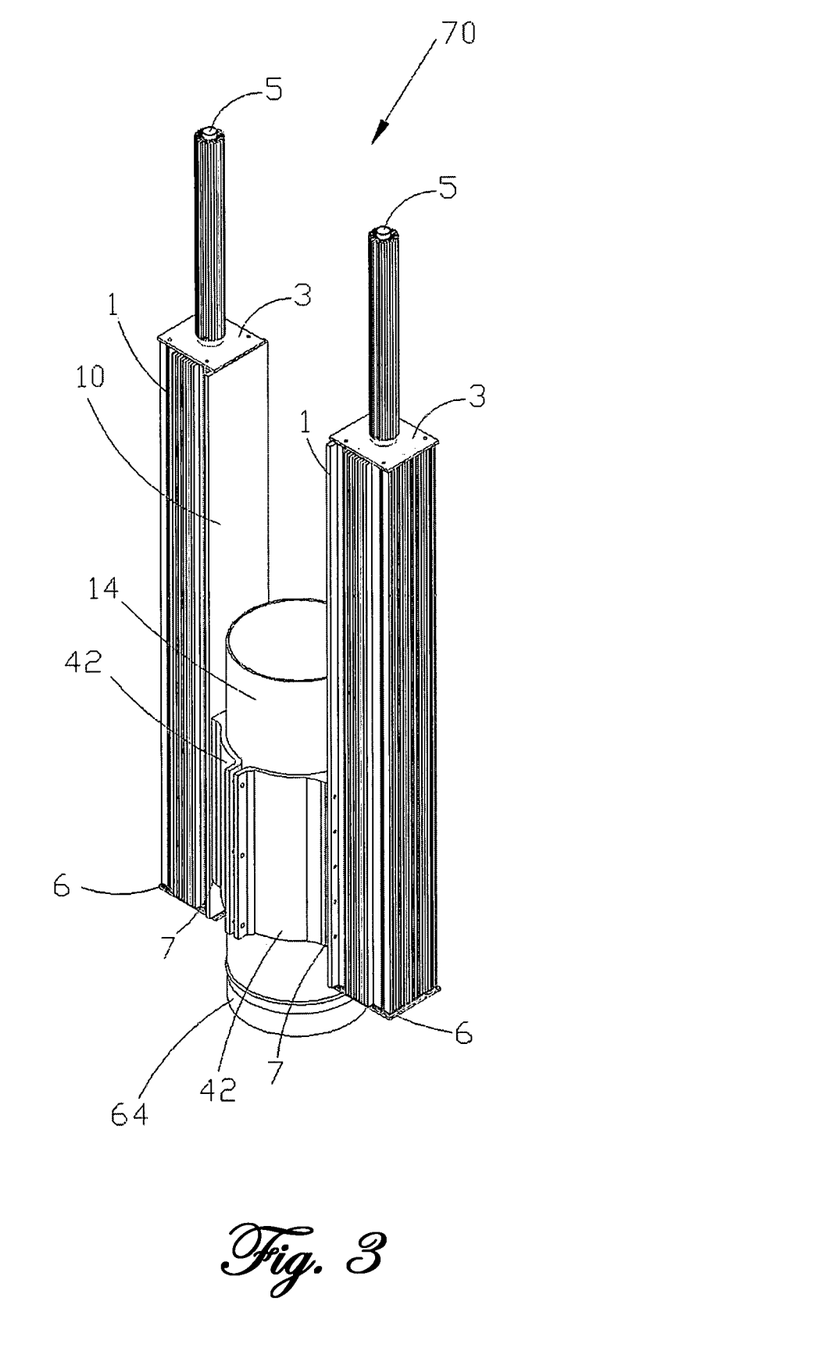
FIG. 3 is an isometric view of a preferred embodiment of a portable, on-demand thermoelectric power generator from the flue stream of a combustion site.

FIG. 3 shows one embodiment of a portable thermoelectric power generator 70 in accordance with the teachings of the present invention. Two vessels 1 are each coupled to a heat absorber 42 that captures energy from a combustion site by sampling the heat from a flue stream 64.

Figure 4:
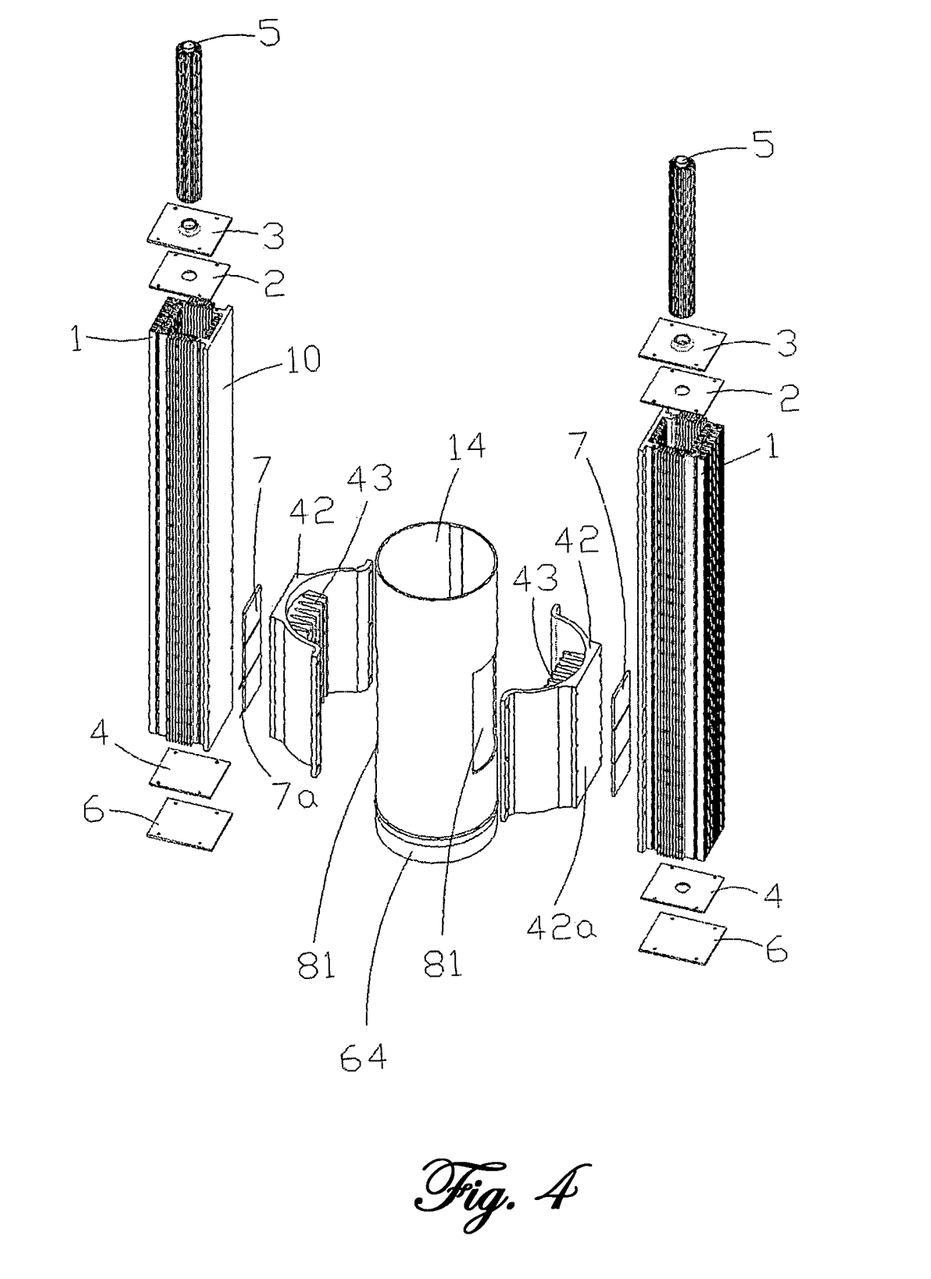
FIG. 4 is an isometric exploded view of a preferred embodiment of a portable, on-demand thermoelectric power generator from the flue stream of a combustion site.

FIG. 4 shows an exploded view of portable thermoelectric power generator 70. The system includes a vessel 1 that functions as a heat exchanger, and retains a liquid coolant, for example water. A heat injection system provides a suitable heat source to the thermoelectric modules 7. The heat injection system includes a heat absorber 42, and a heat source 64. The heat absorber 42 is comprised of an aluminum heat sink extrusion with heat absorbing fins 43 that are large relative to the outer dimensions of the heat fluid source 64. The heat absorber fins 43 are positioned to efficiently collect and conduct heat from the heat source to the hot side of thermoelectric modules. The heat absorber 42 has a planar surface 42a thermally connected to the hot (heat absorption) side of the thermoelectric modules 7.

In this embodiment, the heat is provided by an open flame from a combustion site flue such as a wood stove. In this case, the exhaust stream in flue pipe 64 can be produced by burning any of a variety of biomass choices, wood being a typically popular example. Two heat exchanger vessels 1 are positioned adjacent to flue 64. Each heat exchanger vessel is coupled mechanically to a heat absorber 42 having integral heat absorber fins protruding through suitable apertures 81 in the flue pipe 64 such that the heated exhaust passes over the fins as it flows through the flue duct. In this way, heated fluid from the exhaust stream is absorbed by heat absorbers 42 and conducted to the hot side of thermoelectric modules 7. The cold side of thermoelectric modules 7, are operably coupled to the heat exchanger vessels 1. The arrangement of FIG. 4 may also include electrical control assemblies and liquid exchange taps if suitable for the installation. In addition, the arrangement is not limited to two heat exchanger systems. Flues with larger circumference can accommodate a larger number of heat exchanger systems.

Figure 5:
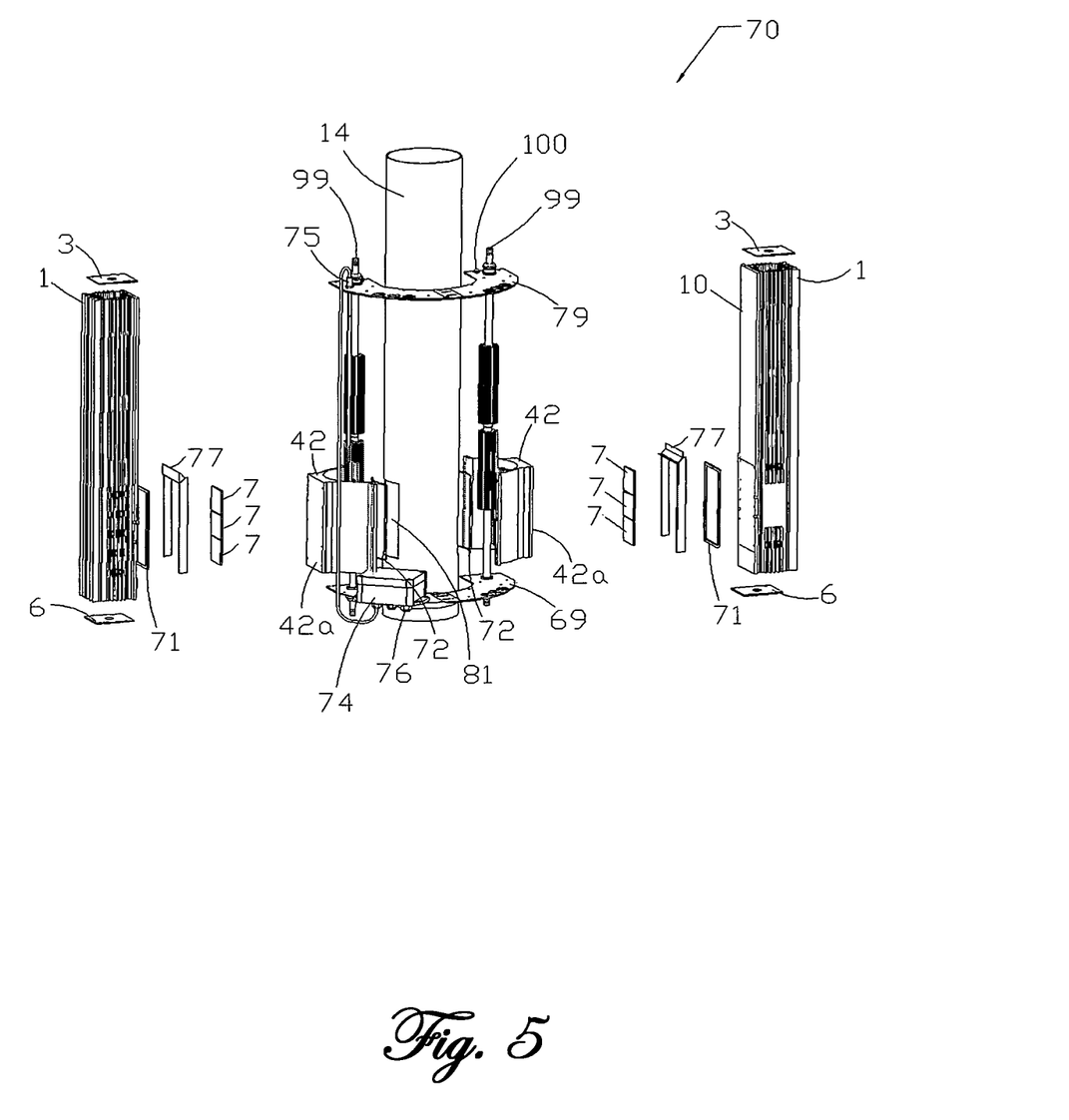
FIG. 5 is an isometric view of a preferred embodiment of a permanently installed, on-demand thermoelectric power generator using the flue stream of a combustion site, including an auxiliary heat exchanger tube for active, low pressure secondary cooling, for use in high ambient temperature conditions with reduced convective air flow.

The embodiment shown in FIG. 5 shows an illustrative system build-out to that of FIG. 4. In this case, the thermoelectric power generator assembly 70 is intended for a permanent indoor-outdoor installation. Several unique features and configurations are present in this embodiment. Heat exchanger mounting brackets 69 and 79 are provided to securely support the thermoelectric generator assembly to a location along the upper flue pipe 14 that is suitable to extract heat from the exhaust stream. There are two heat absorbers 42 mounted to absorb heat from the flue. Heat absorber fins 43 (not shown) are immersed in the exhaust heat stream via opposing apertures 81 to extract heat and conduct it to the hot side of each thermoelectric module 7. Two silicon heat absorber mating gaskets 72, prevent any fluid leaks from inside the flue to ambient. The cold side of each thermoelectric module 7 is connected to a heat exchanger vessel 1.

In this embodiment, the thermoelectric modules 7 are protected from environmental exposure with the combination of silicon sealing gaskets 71 and a simple module cover 77 that can be fabricated with steel or aluminum, steel being a more robust choice, with standard metal-forming techniques that are well understood in the art. In addition, each heat exchanger vessel 1 is fitted with an upper silicon sealing gasket 3, and a lower silicon sealing gasket 6 which serve to prevent coolant leaks during normal operation. Vent plugs 100 are coupled to mounting bracket 79 for each vessel, maintains ambient pressure inside the heat exchanger vessels.

A sensor assembly 75 measures the level and temperature of liquid coolant in each vessel 1. The sensor assembly 75 provides an output signal to interface 74 that is proportional to the level of the coolant remaining in the vessel 1. For example, a capacitive level sensor is known to those skilled in the art and can be used in this embodiment. Furthermore, sensor assembly 75 measures the temperature of the coolant using for example, a thermistor device, which is also conditioned by the electronic interface 74 to provide an output that is proportional to the temperature of the liquid coolant. The method by which the electronic interface 74 is configured to provide the desired proportional liquid level and temperature output states will be readily apparent to anyone skilled in the art of electronics interfacing.

All electrical connections to and from the electronic interface 74, are made by using one of three dedicated water resistant cable glands 76.

A pair of finned heat exchanger tubes 99 are used in a closed loop tube-in-tube heat exchanger configuration. In this case, the heat exchanger tube 99 is mounted inside heat exchanger vessel 1 to assist in maintaining a stable temperature differential across the hot and cold side of the thermoelectric modules 7. There is provided, a pipe gland on the top and bottom ends of heat exchange tube 99 for attachment to external plumbing and tubing for a heat exchange reservoir for cooling, similar to a cooling tower.

Figure 6:
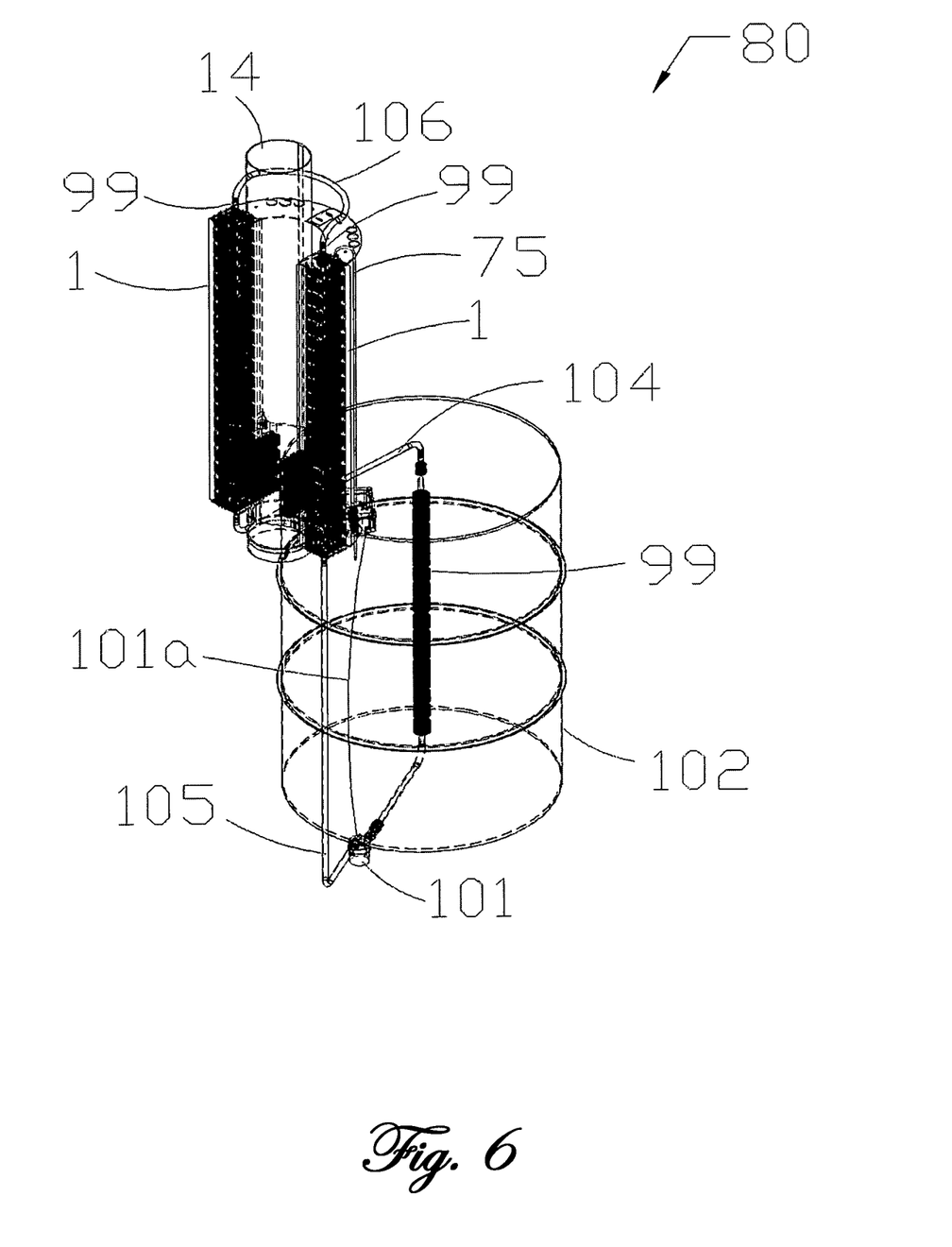
FIG. 6 is an isometric view of an assembled thermoelectric power generator system in conjunction with an external cooling reservoir used with the secondary heat exchanger.

FIG. 6 is an illustration of a thermoelectric power generator system 80 operating with a cooling reservoir 102 of variable size and capacity, coupled to a connection with the heat exchanger tubes 99 by any appropriate means known to those skilled in the art, which function as the primary heat exchanger. Cooling reservoir 102 functions as a secondary heat exchanger and is fitted with an additional finned heat exchanger tube 99 located inside the reservoir 102 which contains a quantity of liquid coolant, which can include water. This secondary reservoir 102 would generally be implemented in situations where the ambient temperature surrounding each vessel 1 is higher than desired, and convection air flows around each vessel 1 are not sufficient to discourage parasitic losses. This is a closed loop, tube-in-tube isolated primary-secondary heat exchanger process. This configuration maximizes the power output from the generator by improving the efficiency of the cooling loop by incorporating a small liquid pump 101 to cycle secondary liquid coolant through the reservoir 102 from the primary heat exchanger tubes 99 in each vessel 1. Thus the heated coolant in the vessels 1 is moved to the reservoir 102 through each heat exchanger tube 99, whereby the excess heat is dissipated and is returned back to the primary heat exchanger vessels 1. The control system for the pump 102 is duty cycle modulated by the system controller 74 which is responsive to the temperature of the liquid coolant inside the vessel 1. Thermistor sensor 75 provides an output proportional to the temperature of the coolant in the primary vessel 1 which allows controller 74 to determine the optimum cycle time to engage pump 102 on and off to maintain the desired coolant temperature in the vessel 1.

Each primary heat exchanger tube 99 is coupled in a serial-cascade connection externally with a flexible tubing loop 106 to maintain nominally the same coolant temperature in both vessels 1 simultaneously. The liquid loop connections to the reservoir 102 are facilitated using extension tube 104 for the upper intake coupling and extension tube 105 for the lower return coupling.

The energizing power for the pump 101 is directed through external control wire assembly 101a.

The assembled power generator is coupled to the flue pipe 14, which is fitted to a combustion site including a wood stove, which is not shown.

What is claimed is:

1. A system to generate usable voltage comprising:
   at least one heat exchanger vessel having a first end and a second end, an interior surface with a set of interior fins, an exterior surface with a set of exterior fins, and an exterior first planar module surface, wherein said first and second ends suitably sealed using a silicone gasket, and incorporating a retainer fabricated from aluminum plate, and fastened to each vessel ends, such that said liquid coolant is retained in the vessel without loss of coolant under operating conditions;
a liquid coolant retained by said heat exchanger vessel;
a heat source comprising a heated fluid;
at least one thermoelectric module having a designated hot side and a cold side thereby creating a voltage output in the presence of a heated fluid;
at least one heat absorber having a second planar module surface and at least one surface with heat absorber fins;
a control module;
wherein said heat absorber fins are immersed in the heated fluid stream, and conduct heat from the heated fluid to the second planar module surface;
the hot side of the at least one thermoelectric module is thermally connected to the second planar module surface;
the cold side of the at least one thermoelectric module is thermally connected to the first planar module surface;
the first planar module surface conducts heat from said cold side to said heat exchanger vessel;
the heat exchanger vessel dissipates said heat from cold side to said liquid coolant via said interior fins and further to the ambient air via said exterior fins;
the heat exchanger vessel acts to maintain said cold side at a temperature lower than said hot side thereby maintaining a temperature differential;
the at least one thermoelectric module produces a voltage while the temperature differential is maintained and the voltage is available to at least one external device via the control module.

2. The system of claim 1 wherein said heat exchanger vessel is an elongated aluminum extrusion oriented vertically with its long dimension substantially parallel to the force of gravity and such that said first end is above said second end, the at least one thermoelectric module is positioned on the first planar module surface and adjacent to said second end such that heat conducted to said liquid coolant warms the coolant, and produces natural convection in the liquid coolant, thus the natural convection creates a flow of warmer liquid coolant toward said first end and cooler liquid coolant returns to said second end.

3. The system of claim 2 further comprising a condenser tube connected to said first end of heat exchanger vessel such that liquid coolant that is converted to a vapor phase by heat from said cold side condenses to a liquid phase on the internal surface of said condenser tube and returns to the liquid coolant in the heat exchanger vessel by gravity flow.

4. The system of claim 1 wherein said heated fluid is heated air and combustion gases produced by burning fuel at a combustion site, chosen from the list including: wood, alcohol, oil, coal, and paper.

5. The system of claim 1 further comprising a plurality of heat absorbers wherein the heat absorber fins of each of the plurality of heat absorbers are immersed in said heated fluid.

6. The system of claim 2 wherein said heat exchanger vessel has a minimum liquid coolant retaining volume of 400 millimeters by 60 millimeters by 65 millimeters.

* * * * *